(12) United States Patent
Wan

(10) Patent No.: US 7,541,214 B2
(45) Date of Patent: Jun. 2, 2009

(54) MICRO-ELECTRO MECHANICAL DEVICE MADE FROM MONO-CRYSTALLINE SILICON AND METHOD OF MANUFACTURE THEREFORE

(75) Inventor: Chang-Feng Wan, 16210 Shadybank Dr., Dallas, TX (US) 75248

(73) Assignee: Chang-Feng Wan

( * ) Notice: Subject to any disclaimer, the term of this patent is extended or adjusted under 35 U.S.C. 154(b) by 1714 days.

(21) Appl. No.: 10/213,564

(22) Filed: Aug. 7, 2002

(65) Prior Publication Data

US 2008/0138922 A1    Jun. 12, 2008

Related U.S. Application Data

(63) Continuation-in-part of application No. 09/461,018, filed on Dec. 15, 1999, now Pat. No. 6,538,296.

(51) Int. Cl.
*H01L 21/00* (2006.01)
(52) U.S. Cl. .......................................... 438/50; 438/52
(58) Field of Classification Search .................. 438/50, 438/52; 257/415
See application file for complete search history.

(56) References Cited

U.S. PATENT DOCUMENTS 4,262,399 A *  4/1981  Cady ........................... 438/53
6,060,336 A    5/2000  Wan

* cited by examiner

*Primary Examiner*—Phat X Cao

(57) ABSTRACT

The present invention is related to a method for manufacturing micro-electro-mechanical systems (MEMS) having movable and stationary suspended structures formed from mono-crystalline silicon wafer or chip, bonded to a substrate wafer with an polymer adhesive layer that serves as spacer and as a sacrificial layer which is undercut by dry etch means. The substrate wafer contains electronic circuits for sensing and actuating the suspended structure by electrical means. Electrical interconnections between the suspended structures and the substrate can be made by etching through via holes in the suspended structure and the adhesive, depositing metal layers in the via holes, and removing the metal layers from outside the via holes. The metal layers in the via holes can also be used as pillars for supporting the suspended structures. This method can be used to manufacture inertial sensors.

8 Claims, 8 Drawing Sheets

Top view

Cross sectional view

MICRO-ELECTRO MECHANICAL DEVICE MADE FROM MONO-CRYSTALLINE SILICON AND METHOD OF MANUFACTURE THEREFORE

CROSS REFERENCE TO RELATED APPLICATION

This continuation-in-part application claims the benefit of patent application Ser. No. 09/461,018, filed Dec. 15, 1999 now U.S. Pat. No. 6,538,296 and entitled "A MICRO-ELECTRO MECHANICAL DEVICE MADE FROM MONO-CRYSTALLINE SILICON AND METHOD OF MANUFACTURE THEREFORE."

BACKGROUND OF THE INVENTION

1. Technical Field of the Invention

The present invention relates to a micromachining process that is compatible with dry-etchable sacrificial layers, thick mono-crystalline suspended layers, on-chip electronics on the substrate and, in particular, to a interconnect between the thick mono-crystalline suspended layers and the microelectronics on the substrate.

2. Description of the Related Art

A micro-electro-mechanical system (MEMS) is a device that transforms mechanical activity into electrical signals and vice versa. A key element in MEMS is a variable capacitor formed between a stationary electrode and a movable electrode attached to a suspended proof mass. The movable electrode deflects in response to acceleration or Coriolis force exerted on the proof mass, or electrical voltage applied between the stationary and the movable electrodes. The amount of deflection can be sensed from changes in capacitance from the changes in the gap between the two electrodes due to deflection. The amount of deflection can also be sensed with piezoelectric or piezo-resistive layers formed on the microstructure. One example is an accelerometer that comprises a rectangular membrane, one side of which is fixed to a carrier while the other is suspended, and a means for detecting the movement of the membrane under the effect of acceleration. This constitutes a sensor, which senses acceleration force. Conversely, an electrical signal applied to the capacitive plates or piezoelectric layers can result in deflection in the movable elements. This generates a force internally that can be used as an engine to drive the MEMS device. MEMS devices may comprise both drive elements and sensing elements to perform specific functions. One such example is a MEMS gyroscope fabricated with micromachining techniques.

There are two major classifications of methods for making thin suspended microstructures: (1) Bulk micro-machining, where the transducers are primarily shaped by etching a thick mono-crystalline silicon substrate; and (2) Surface micro-machining, where transducers are constructed entirely from thin films deposited on respective sacrificial layers. Mono-crystalline silicon used in bulk micro-machining has two major benefits. The first benefit is the silicon is almost a perfect mechanical material. It's stronger than steel by weight; does not show mechanical hysteresis and is highly sensitive to stress. This technology requires a deep silicon etch to remove the bulk of the material to form the microstructures. This is normally done by anisotropic wet etch where both dimension control and contamination control is a major challenge. An important feature of bulk micro-machining is the microstructure is often bonded to another wafer for packaging. The bonding techniques include anodic bonding, metallic seals, and low-temperature glass bonding. Polymer bonding is attractive because it is widely used in attaching semiconductor dies to substrates for packaging, but it is rarely used in micro-machining as most of these applications require very thin bondlines. The application of a thin layer of polymer adhesive requires thinning with solvent that is incompatible with most micro-machining techniques.

Surface micro-machined MEMS devices are constructed entirely from thin films deposited on a sacrificial layer. These devices allow for monolithic integration with silicon processors using the standard silicon process technology commonly known to individuals skilled in the art. The sacrificial layer is either made of a polymer such as photoresist or an inpolymer substance such as silicon oxide. Photoresist can be dry etched in oxygen plasma but can not withstand high temperature anneal like silicon dioxide can. Chemical-vapor deposited polysilicon film is used in integrated accelerometers and many other MEMS devices. Unfortunately, it must be annealed at a high temperature (~1000° C.) to reduce stress, or its suspended structure will curl after the sacrificial layer is removed from underneath. The sacrificial layer is made of silicon dioxide whose removal is by wet etch in HF acid. Surface tension of the aqueous HF acid solution exerts forces on the suspended microstructure, which pulls the microstructure into contact with the substrate and causes them to stick together. To separate them without causing damage is difficult because the combination of adhesive forces and electrostatic forces is large compared to the strength of the thin films. Another drawback is that the metal interconnect in the integrated control circuits cannot withstand the high temperature anneal. Therefore, it must be formed after the polysilicon suspended structure is formed. Protecting the suspended structure during the interconnect process and the wet etch is a complex matter and entails the usage of costly state-of-the-art fabrication facilities.

Surface micro-machining that does not require high temperature anneal has distinct advantages because dry etch can be used for removing the sacrificial layer and the microstructure can be fabricated on finished integrated circuits. This avoids the sticking associated with the wet etch process and the expensive equipment thereby necessitated. However, the intrinsic stress and hysteresis in the deposited film limits its thickness to a few thousand angstroms or the films can curl and change after stressing. This makes the technique not suitable for devices such as accelerometers that require larger proof mass.

Therefore, it is highly desirable to combine the merits of both bulk and surface micro-machining techniques—such as MEMS devices employing suspended structures made from mono-crystalline silicon by a surface micro-machining method. One example is surface micro-machined accelerometers made with silicon-on-insulator (SOI) wafers, wherein thick mono-crystalline silicon is bonded to another silicon wafer with a silicon oxide insulator in between. The suspended structure can be made much thicker than mono-crystalline for increased proof mass. However, SOI wafers are much more expensive than the regular wafers and its production employs a high temperature process that is not compatible with integrated circuits and dry-etchable sacrificial layers. It would be of great advantage if the sacrificial layer were dry-etchable.

Another issue related to non-dry-etchable sacrificial layers relates to packaging, where they must be wet etched and movable elements released prior to packaging. Extreme care must be taken to attach these MEMS devices during packaging.

U.S. Pat. No. 6,060,336 describes a method to fabricate MEMS devices that combines the merits of both bulk micromachining and surface micromachining techniques. It employs mono-crystalline silicon for making suspended structures from and polymer adhesive as the dry-etchable sacrificial layer, spacer and pillar for supporting the suspended structures. The method solves most of the aforementioned issues in MEMS manufacturing and cuts the cost of packaging where release of the suspended structures can be done after the devices are mounted in the packages.

One potential drawback for MEMS devices that employ mono-crystalline suspended structures such as that manufactured with the method provided in U.S. Pat. No. 6,060,336, is that electrical interconnection between the suspended structures and the microelectronics is with bond wires, which require bonding pads and area. Thus, the number of bond wires interconnection is limited.

Another potential drawback for such MEMS devices which employ polymer adhesive pillars to bond and support mono-crystalline suspended structures with the substrate is the polymer adhesive pillars may outgas and deteriorate vacuum packaging. Thus there is a need to employ metal interconnects that double as pillars, so that the polymer adhesive layers can be removed totally.

All MEMS inertial sensors such as gyroscopes and accelerometers operate on the principle of proof mass suspended by flexures anchored to the substrate. The flexures serve as the flexible suspension between the proof mass and the substrate, making the mass free to move in response to external forces or acceleration. The movement can be measured with a built-in variable capacitor or piezoelectric sense elements. In the case of MEMS gyroscopes, the proof mass is driven into vibratory motion in the x-direction by an external sinusoidal force with the drive. If the gyroscope is subjected to an angular rotation in the z-direction, the Coriolis force is induced in the y-direction. The resulting oscillation amplitude in the sense direction is proportional to the Coriolis force, and thus to the angular velocity to be measured. These MEMS gyroscopes are very small in size to satisfy yield and cost considerations, thus signal response is very weak, due in part to the smallness of the proof mass and sense capacitors, making it difficult to achieve the high accuracy needed for gyroscopes used in navigation applications. Thus, it is highly desirable to increase both the area and thickness of the suspended layer in these devices to increase the signal strength; likewise for MEMS accelerometers. Both the proof mass and sense capacitors must be large enough to archive desired accuracy. In addition, there is a need to have integrated electronics on the same chip to eliminate long metal leads that are used to connect the MEMS with off-chip electronics and can pick up excess noise. Furthermore, there is a need to use thermally matched substrates as a base for the suspended structure to anchor to for improved stability during operation, as thermal stress may change the drive and sense resonant frequencies and induce errors.

Unfortunately, surface micromachining techniques base on LPCVD polysilicon layers have very limited layer thickness (~5 μm) and suffer from residue stress from the deposition process. The bulk micromachining process uses mono-crystalline silicon to form the suspended structures, such as the proof mass, and does not suffer from residue stress and thickness limitations. But the substrate that the suspended structure is bonded to is normally made of glass. Therefore, there is a significant amount of mismatch in thermal expansion coefficients between the two that cause errors from fluctuations in operating temperature. Furthermore, readout and control electronics cannot be integrated on the same chip. This substantially increases complexity of the gyroscope subsystem and thus cost, size, and power consumption. Thickness of the silicon layer is larger but still limited, to ~10 μm, in a tuning-fork MEMS gyroscope fabricated using this technique.

Hence, there is a strong need in the industry to overcome the aforementioned shortcomings of the present art.

SUMMARY OF THE INVENTION

It is one object of the present invention to improve the performance of micro-electro-mechanical inertial sensors, i.e., gyroscopes and accelerometers.

It is another object of the present invention to improve a method of manufacturing micro-electro-mechanical devices, to allow forming metal interconnects between suspended mono-crystalline structures of micro-sensors and substrates, where integrated circuits are allowed to be present.

It is another object of the present invention to improve a method of manufacturing micro-electro-mechanical devices, which therefore allows for the fabrication of the suspended structures by dry etching and total removal of the sacrificial layer.

It is another object of the present invention to improve a method of manufacturing micro-electro-mechanical device, which therefore allows a plurality of mono-crystalline material chips to be mounted on substrate wafer at selected areas for fabrication.

It is yet another object of the present invention to improve a method of manufacturing micro-electro-mechanical devices which therefore allows multiple layers of mono-crystalline silicon to be mounted on the substrate wafer and for fabrication of devices having multiple layers of suspended structures.

It is another object of the present invention to improve a micro-electro-mechanical device to employ differential capacitor for improved performance The above and other objects are achieved by providing a micro-electro-mechanical device with a suspended structure that is formed from mono-crystalline silicon, bonded to a substrate wafer with a polymer adhesive layer, wherein metal interconnects are formed between the mono-crystalline silicon and the underlying substrate wafer or mono-crystalline silicon; the polymer adhesive layer serves as a sacrificial layer as well as a spacer. The fabrication is completed with a monolithic surface micro-machining technique and said sacrificed polymer adhesive layer is removed by a dry etch means.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1A:
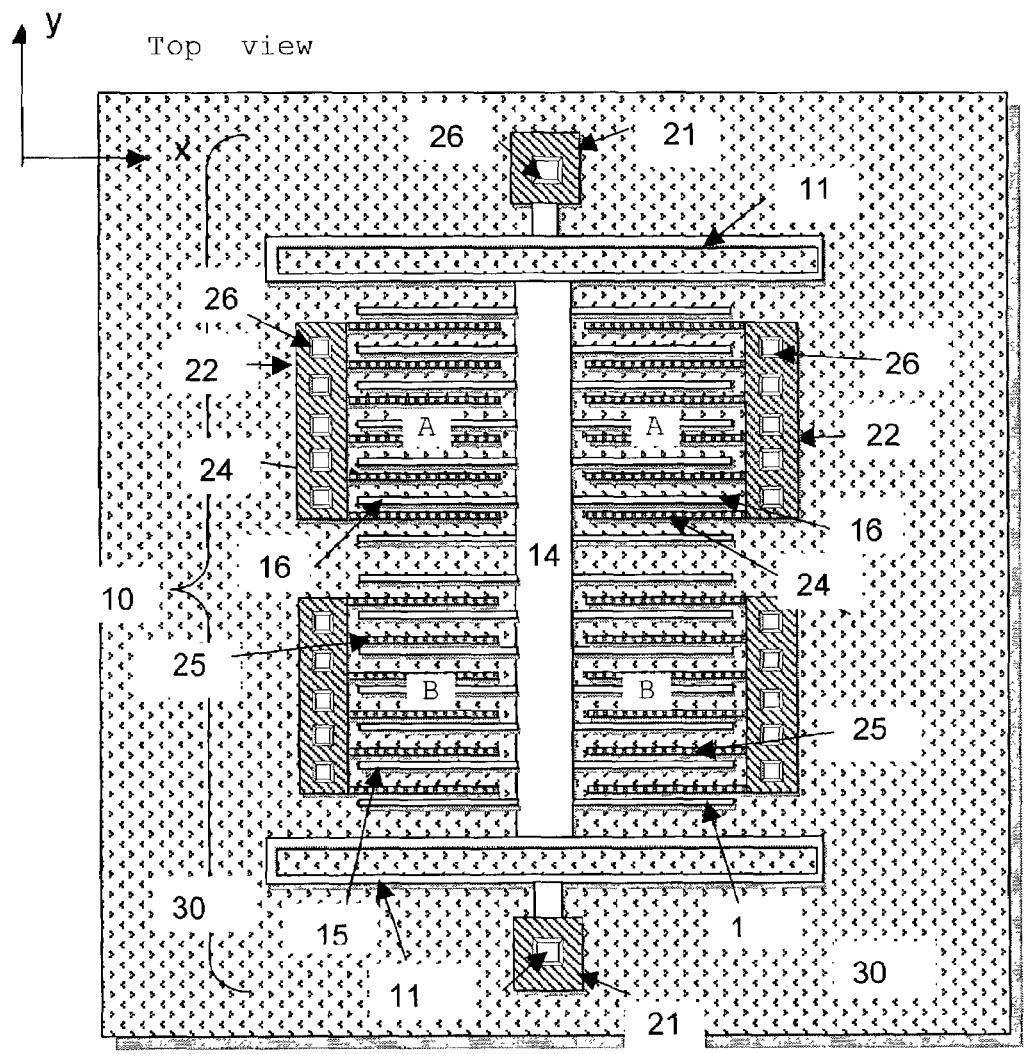
FIG. 1a is a perspective view of the accelerometer embodiment of the inertial sensors of the present invention.
Figure 1A:
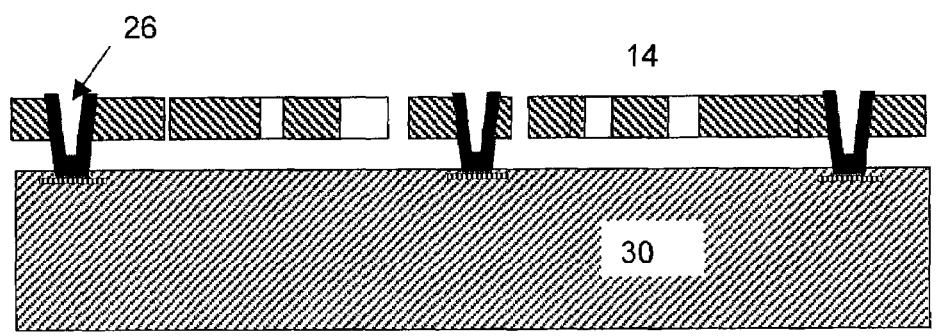

Reference is made to FIG. 1a, wherein an accelerometer embodiment of the present invention is depicted, in both a top view and a cross sectional view. This accelerometer MEMS device comprises suspended structures 10, anchored on a substrate 30, which is shown as the large rectangle in the background. The suspended structure is fabricated from a doped mono-crystalline silicon wafer; the substrate comprises electrical components, such as signal processing integrated circuitry, metal landing pads, metal strips and capacitive plates. The suspended structure 10 comprises movable elements and stationary elements. The movable elements include proof mass 14, having a movable, rectangular beam and a plurality of fingers 15 and 16 extending from both sides, and two flexure springs 11, which connect each end of the proof mass 14 to anchors. The stationary elements include anchoring plates 21 and 22 which fasten the suspended structures to the substrate 30, a plurality of stationary fingers 24 and 25, and metal interconnects 26, which make electrical interconnections between electrical circuits on the substrate 30 and the suspended structures. It also serves as pillars for the latter. Anchoring plates 21 anchor and support the movable elements, while anchoring plates 22 anchors and support stationary fingers 24 and 25. Interdigiting fingers 16 and 24, and interdigiting fingers 15 and 25 form sidewall capacitors A and B, respectively, which are variable. The interdigiting fingers are offset so that the gaps between one finger and its two neighboring fingers are substantially different. The capacitance values of capacitors A and B are nominally equal. The capacitance value of capacitor A increases when an acceleration force in the y direction is applied, while that of capacitor B decreases, and vice versa. Thus, capacitor A can be called a forward capacitor and capacitor B can be called a backward capacitor. Such configuration is designed for differential sensing operation, where the difference in capacitance of the two capacitors can result in output voltage on the node of movable fingers to be substantially proportional to the acceleration force. The two capacitors A and B are said to form a differential capacitor. The output carries a sign that reflects direction of the force, and rejects many effects of $1^{st}$ order, thus is the preferred way of operation. The technique and principles of differential sensing can be found in a book entitled Microsystem Design by S. D. Senturia, Kluwer Academic Publishers, 2001. The configuration shown in FIG. 1a is designed to achieve such for MEMS devices fabricated with the method described in U.S. Pat. No. 6,060,336.

Figure 1B:
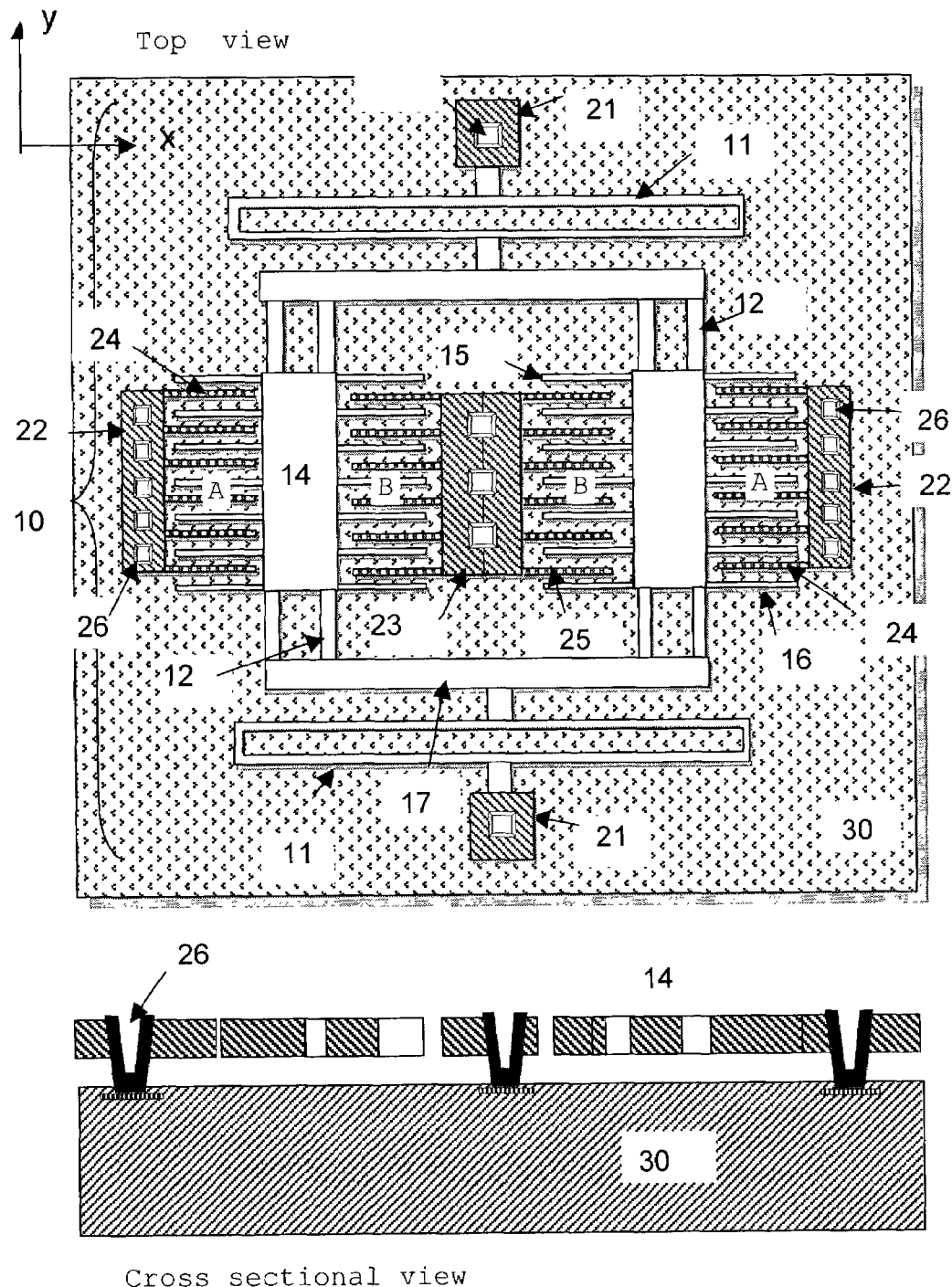
FIG. 1b is a perspective view of another accelerometer embodiment of the inertial sensors of the present invention.

Reference is now made to FIG. 1b, wherein another accelerometer embodiment of the present invention is depicted, in both a top view and a cross sectional view. This accelerometer MEMS device comprises suspended structures 10, anchored on a substrate 30, shown as the large rectangle in the background. The suspended structure is fabricated from a doped mono-crystalline silicon wafer; the substrate comprises electrical components such as signal processing integrated circuitry, metal landing pads, metal strips and capacitive plates. The suspended structure 10 comprises movable elements and stationary elements. The movable elements include proof masses 14, each having a plurality of movable fingers 15 and 16 extending from two opposite sides, and two beams 12, that are extended to wide stiff crossbars 17, which in turn are connected to flexure springs 11. The stationary elements include anchoring plates 21, 22 and 23, which fasten the suspended structures to the substrate 30 and a plurality of stationary fingers 24 and 25. Metal interconnects 26 make electrical connections between electrical circuits on the substrate 30 and suspended structures, and serves as pillars for the latter. Anchoring plates 21 anchor and support the movable elements, while anchoring plates 22 anchor and support a plurality of stationary fingers 24 and 25. Interdigiting fingers 16 and 24, and interdigiting fingers 15 and 25 form two pairs of sidewall capacitors A and B, respectively, which are variable. The interdigiting fingers are offset so that the gaps to the two neighboring fingers are offset such that the gaps between one finger and its two neighboring fingers are substantially different. The capacitance value of capacitor A increases when an acceleration force in the y direction is applied, while that of capacitor B decreases, and vice versa. Such arrangement is again designed for capacitors A and B to form two differential capacitors that are symmetric with respective to each other. That is, the two beams 14 with variable capacitors are mirror images of each other. In this configuration there are two differential capacitors that are connected in parallel electrically. Such configuration has the advantage of an increased capacitance for improved performance.

Figure 1C:
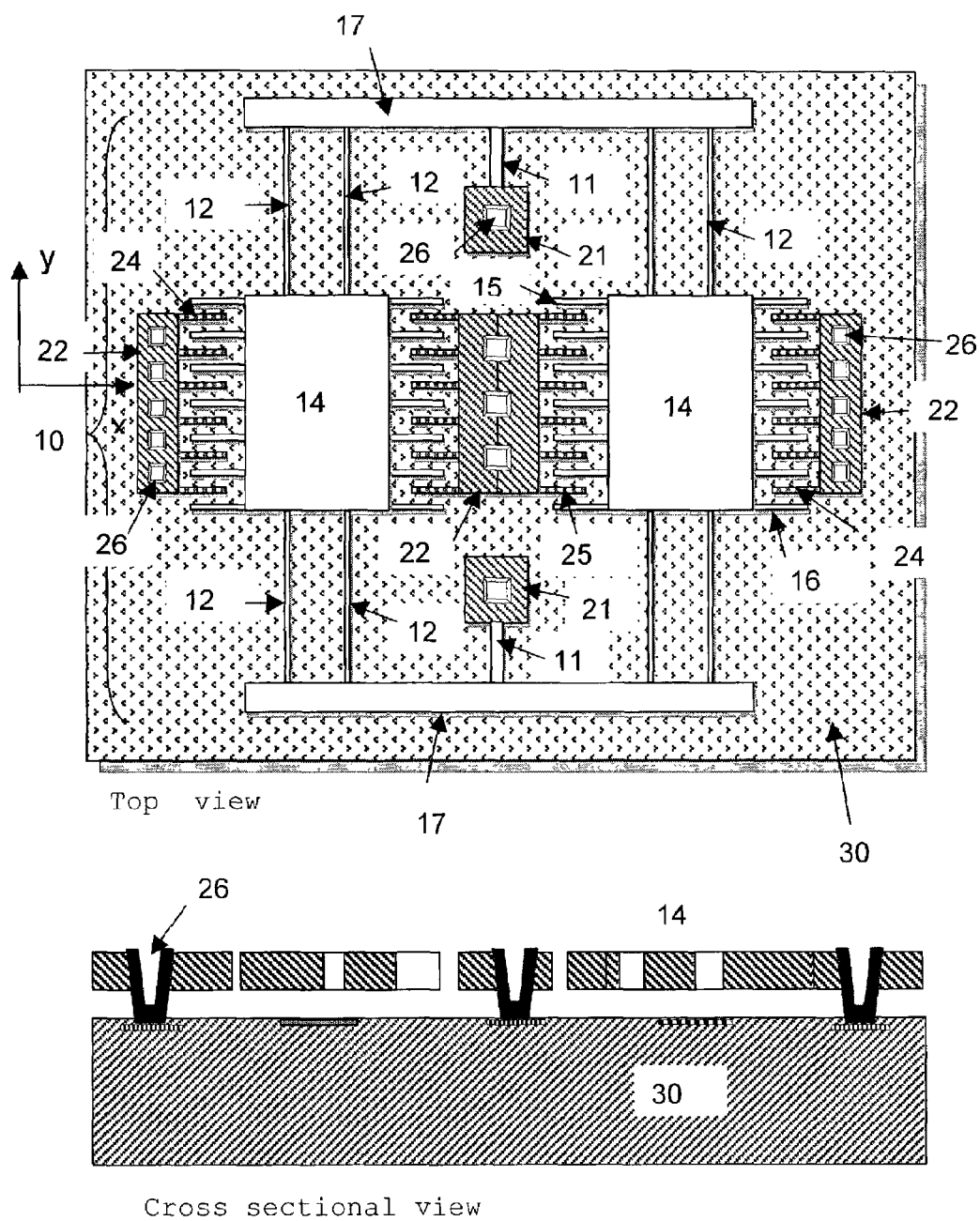
FIG. 1c is a perspective view of the gyroscope embodiment of the inertial sensors of the present invention.

Reference is now made to FIG. 1c, wherein a tuning-fork gyroscope embodiment of the present invention is depicted, in both schematic top view and cross sectional view. This gyroscope MEMS device comprises suspended structures 10, anchored on a substrate 30. The suspended structure is fabricated from a doped mono-crystalline silicon wafer; the substrate comprises electrical components such as signal processing integrated circuitry, metal landing pads, metal strips and capacitive plates. The suspended structure 10 comprises movable elements and stationary elements. The movable elements include proof masses 14, each having a plurality of movable fingers 15 and 16 extending from two opposite sides, and two narrow flexible beams 12, that are extended to wide stiff crossbars 17, which in turn are connected to torsion beams 11. The stationary elements include anchoring plates 21 and 22, which fasten the suspended structures to the substrate 30 and a plurality of stationary fingers 25. Metal interconnects 26 make electrical connections between electrical circuits on the substrate 30 and suspended structures and serves as pillars for the latter. Anchoring plates 21 anchor and support the movable elements, while anchoring plates 22 anchor and support a plurality of stationary fingers 24 and 25. Interdigiting fingers 16 and 24 form sidewall capacitors that can be used to detect and control deflection of proof masses 14, while interdigiting fingers 15 and 25 form comb drives.

When a sinusoidal voltage is applied to the anchoring plate 22 and fingers attached thereto, the two proof masses 14 will be excited into anti-parallel motion in x-direction. An angular rate in y-direction will induce a Coriolis force that induces the proof mass 14 in a torsional vibratory movement around torsion beams 11, or y-axis. The vibratory motion can be detected by sensing the capacitance between the two proof mass plates 14 and electrodes on the substrate 30 beneath. Additional electrodes are placed underneath the proof mass plates for force feedback usage and for applying a static voltage to trim the torsional resonance frequency. To get the highest amplitudes, the proof masses will be excited at resonance frequency.

The suspended structures of inertial sensors shown in FIG. 1a, FIG. 1b, and FIG. 1c can be built with an epoxy-bonded mono-crystalline silicon layer using the aforementioned micromachining technique described in U.S. Pat. No. 6,060,336. For better sensor performance, the thickness of the mono-crystalline silicon suspended structures needs to be >20 μm. For even better performance, the epoxy bonding and support layer is totally removed, and the suspended structures are supported by the metal interconnect/pillars. Thus the electrical interconnection is shortened and the epoxy, having substantially higher thermal expansion coefficient than silicon, is removed.

Referring now to FIGS. 2 to 6, there is depicted cross-sectional side views showing a particular portion of a microstructure during specific phases of the fabrication process for the interconnect/pillar. The thicknesses and gaps are not shown to scale.

Figure 2:
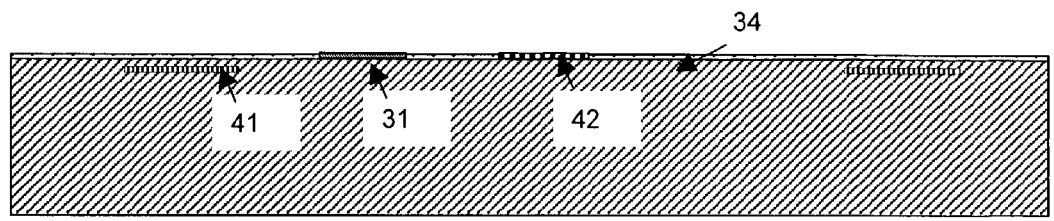
FIG. 2 is a cross-sectional view of the first stage of production of the inertial sensors of FIG. 1.
Figure 3:
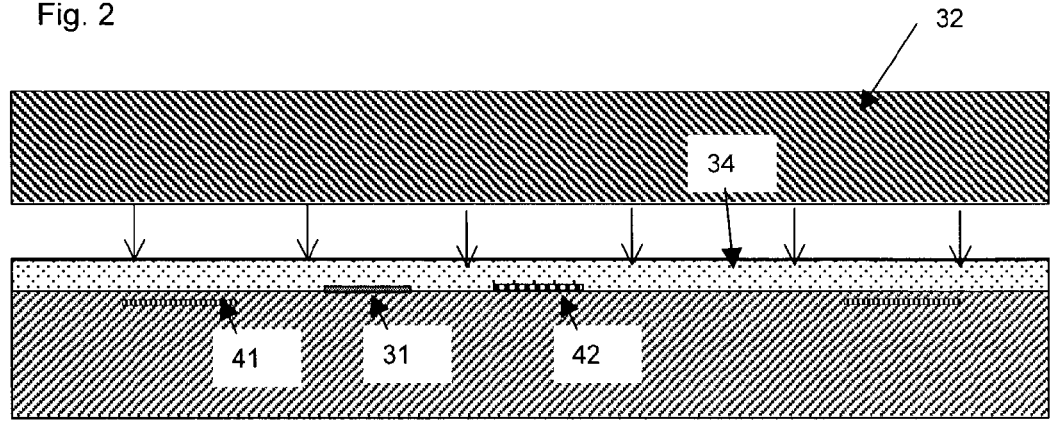
FIG. 3 is a cross-sectional view of the second stage of production of the inertial sensors of FIG. 1.

FIG. 2 is a cross sectional side view of a substrate wafer 30 comprising electrical components such as CMOS, metal landing pads 41, bond pads 42 and electrodes 31; coating substrate wafer 30 with an polymer adhesive layer 34 by one of the following methods: spinning, spraying, inkjet printing or dipping.

Figure 4:
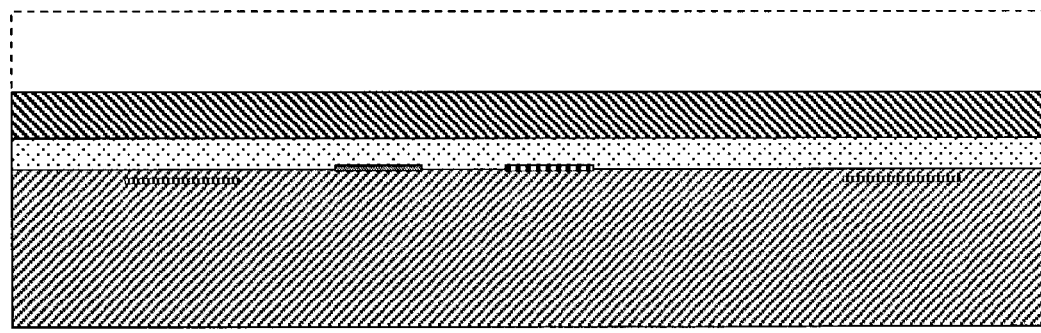
FIG. 4 is a cross-sectional view of the third stage of production of the inertial sensors of FIG. 1.
Figure 5:
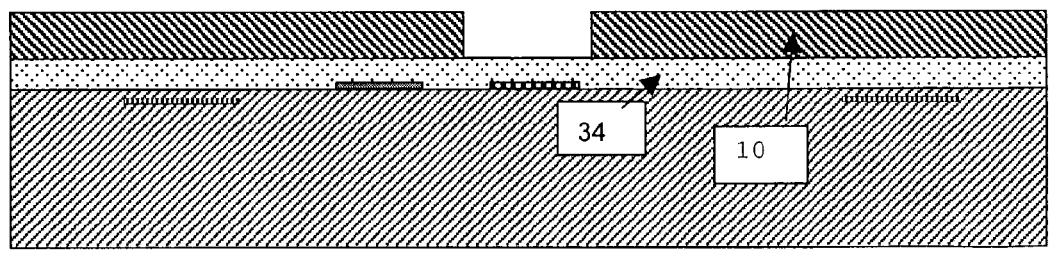
FIG. 5 is a cross-sectional view of the fourth stage of production of the inertial sensors of FIG. 1.

Spinning is preferred. The polymer adhesives include thermoplastic and thermoset polymers such as epoxy, BCB (benzocyclobutene), photoresist, and polyimide. Epoxy is preferred. Solvent is used to dilute the adhesive and spin speed may be adjusted, for adjusting thickness of the coating. To reach this stage of the process, a layer of polymer adhesive is applied on one side of one or both substrate 30 and a doped mono-crystalline silicon wafer 32, FIG. 3. The polymer adhesive may or may not be patterned. Next the adhesive-coated sides of the two wafers are brought into contact with each other in a press, wherein pressure and heat are applied under a vacuum. Heating softens the B-staged epoxy, restores its tackiness for bonding and subsequently cures it. Heating facilitates the bonding process and cures the epoxy, while the vacuum eliminates gas bubbles in the bondline as they are detrimental in the subsequent thinning of the top wafer because they create dents on the surface. After the wafers are bonded, the top wafer is thinned to the desired thickness (FIG. 4). Next, a photoresist pattern is formed and etched on the doped mono-crystalline silicon wafer 32 (FIG. 5) to demarcate the suspended region, or top layer 10, and to expose alignment marks, scribe lines, and electrodes 31 on the substrate wafer.

Figure 6:
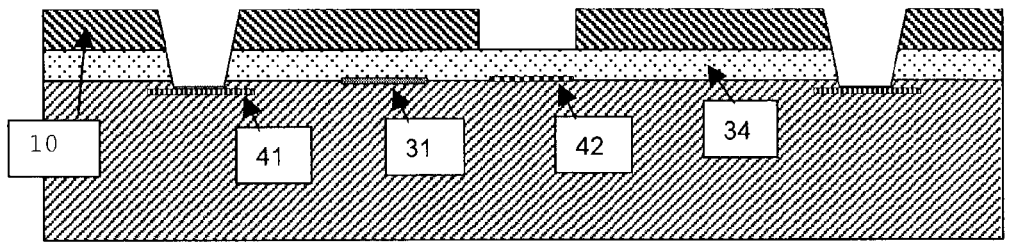
FIG. 6 is a cross-sectional view of the fifth stage of production of the inertial sensors of FIG. 1.
Figure 7:
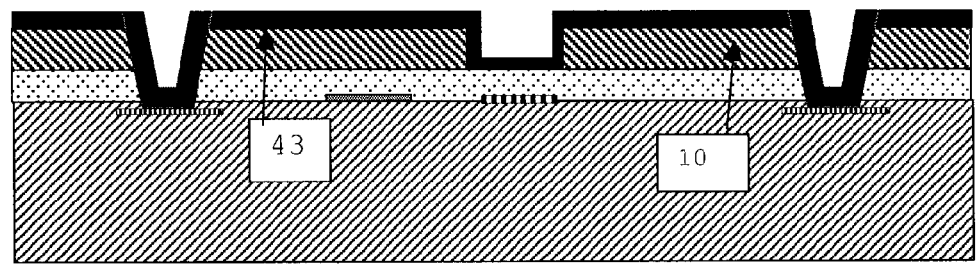
FIG. 7 is a cross-sectional view of the sixth stage of production of the inertial sensors of FIG.
Figure 8:
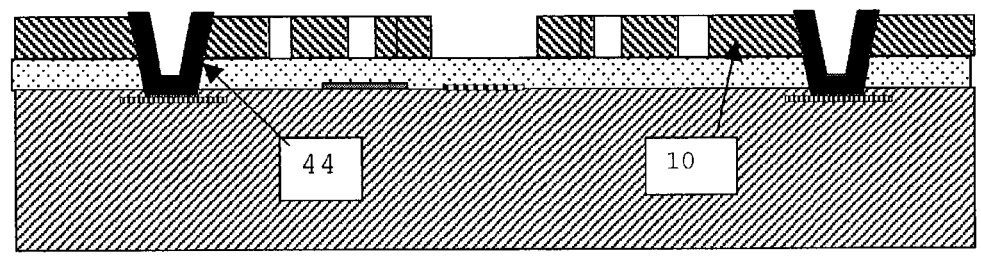
FIG. 8 is a cross-sectional view of the seventh stage of production of the inertial sensors of FIG. 1.
Figure 9:
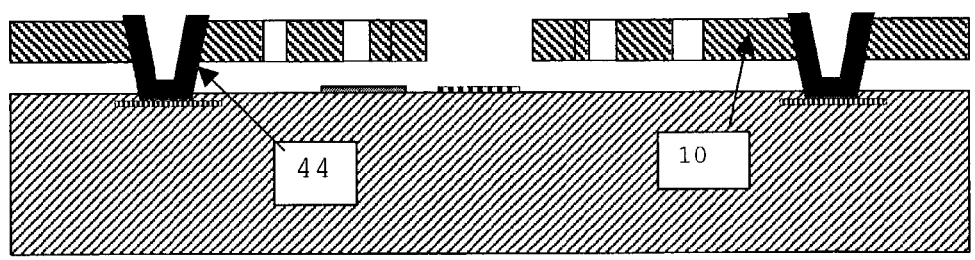
FIG. 9 is a cross-sectional view of the eighth stage of production of the inertial sensors of FIG. 1.

Next, ohmic contact (not shown) is formed on the top wafer 32 and the substrate 30 using standard metal deposition and photolithography processes. Next, via holes are patterned and etched to the landing pads 41 through the top layer 10, the epoxy bonding layer 34, and possible insulator layer over the landing pads (FIG. 6). Next, metal layers 43 are deposited by sputtering with good step coverage (FIG. 7). Refractory metals such as tungsten, titanium, and their alloys are preferred choice. The metal layers 43 is then removed from outside the via holes by dry etch processes, leaving metal plugs 44 in the via holes as shown in FIG. 8. The metal plugs serve as electrical interconnects between the top wafer 10 and the substrate 30, as well as support pillars. Next trenches are etched in the top wafer using a deep reactive ion etch (DRIE) that stops at the underlying epoxy layer, still seen in FIG. 8. At this point, the wafer is diced into individual devices and mounted in packages. Finally an oxygen-containing plasma etch is used to etch with undercut the sacrificial epoxy layer, freeing the etched top layer 10 (FIG. 9). Either the remaining epoxy layer 34 or the metal plugs 44, or both can be used to support the suspended structures. In certain applications the use of epoxy as pillars is undesirable, such as in high precision inertial sensor applications where the high thermal expansion coefficient of epoxy may affect performance, and in vacuum packaging where the epoxy layer may outgas to degrade the vacuum, the epoxy layer will be totally removed. Then the metal plugs alone are used as support, and refractory metals such as tungsten, titanium, tantalum, and their alloys such as TiW and TiN are favored material to use due to higher stiffness.

Figure 10:
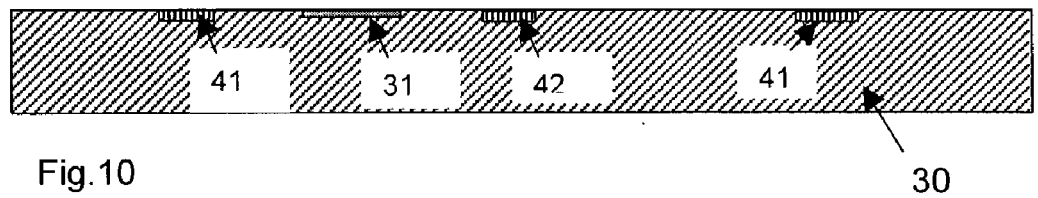
FIG. 10 is a cross-sectional view of the initial stage of production of the inertial sensors of FIG. 1, using an alternate approach.
Figure 11:
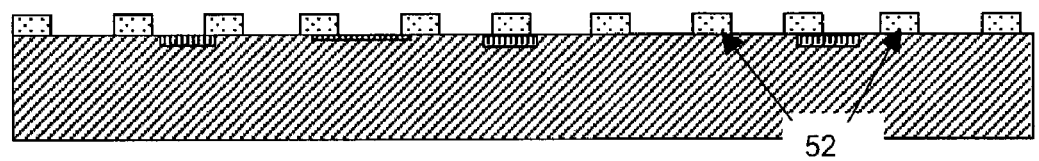
FIG. 11 is a cross-sectional view of the second stage of production of the inertial sensors of FIG. 1, using the alternate approach of FIG. 10.
Figure 12:
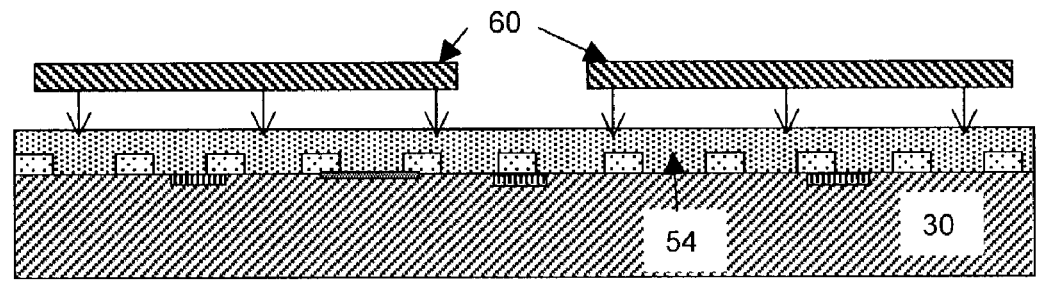
FIG. 12 is a cross-sectional view of the third stage of production of the inertial sensors of FIG. 1, using the alternate approach of FIG. 10.
Figure 13:
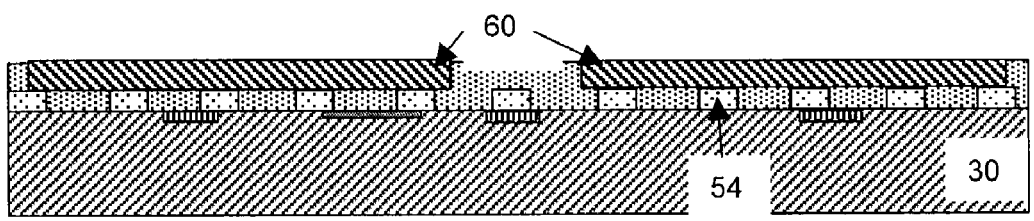
FIG. 13 is a cross-sectional view of the fourth stage of production of the inertial sensors of FIG. 1, using the alternate approach of FIG. 10.
Figure 14:
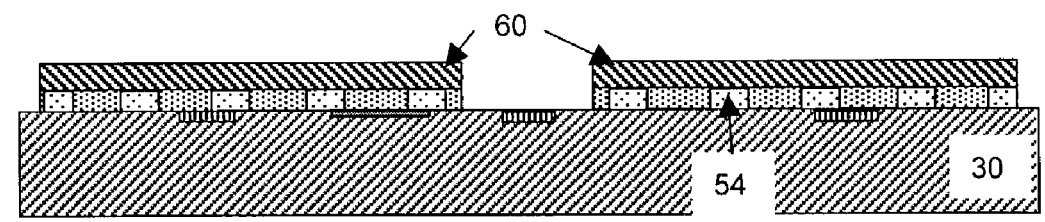
FIG. 14 is a cross-sectional view of the fifth stage of production of the inertial sensors of FIG. 1, using the alternate approach of FIG. 10.

Sometimes it may be advantageous to mount small, individual chips of doped mono-crystalline silicon onto the substrate wafer for processing, such as when precise thickness control is required. FIG. 10 is a cross sectional side view of substrate wafer 30 comprising electrodes 31, bond pads 42, and landing pads 41. FIG. 11 shows a plurality of photoresist dots 52 are deposited on the substrate by photolithography means. Next polymer adhesives are dispensed on the substrate wafer 30, and the doped mono-crystalline silicon chips 60 are placed on the substrate wafer 30 (FIG. 12) at predetermined locations. Commercially pick-and-place die attach systems can do this task efficiently. Next a bladder press is used to press the chips 60 and the substrate wafer together at slightly elevated temperature at which the epoxy can flow and gel easily. FIG. 13 shows the silicon chips 60 are pressed against the substrate wafer 30, after the epoxy is squeezed out from under the silicon chip 60 until they rest on the photoresist dots 54. Thus, the height of the photoresist dots 54 determines the gap between suspended structure and the substrate. The elevated temperature during press allows the epoxy to gel (B-staging) and hold the silicon chips 60 in place after the press, and excess epoxy between the silicon chips 60 can be removed with solvent. FIG. 14 shows the wafer after excess epoxy is removed. From this point, the mounted mono-crystalline silicon can be thinned, polished and micromachined to produce desired MEMS devices such as the inertial sensors in FIG. 1.

Figure 15:
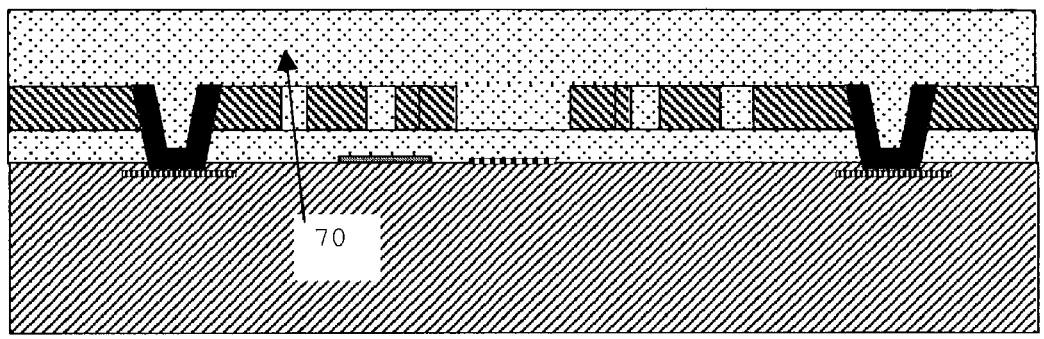
FIG. 15 is a cross-sectional view of the initial stage of production of the inertial sensors having multiple layers of suspended structures.
Figure 16:
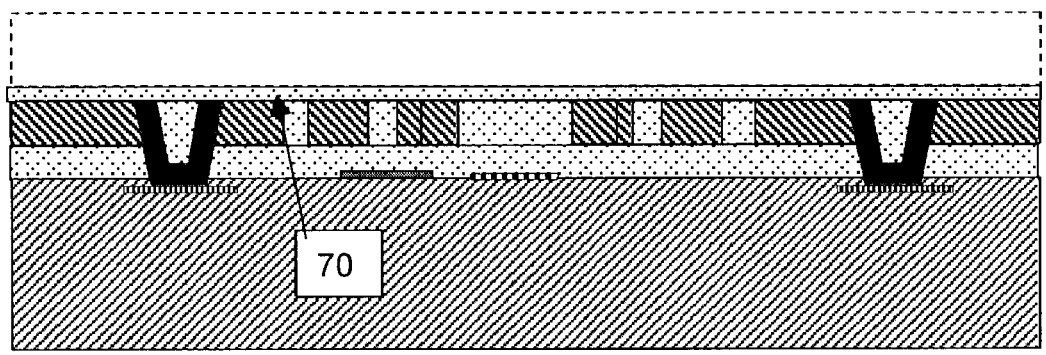
FIG. 16 is a cross-sectional view of the second stage of production of the inertial sensors having multiple layers of suspended structures.
Figure 17:
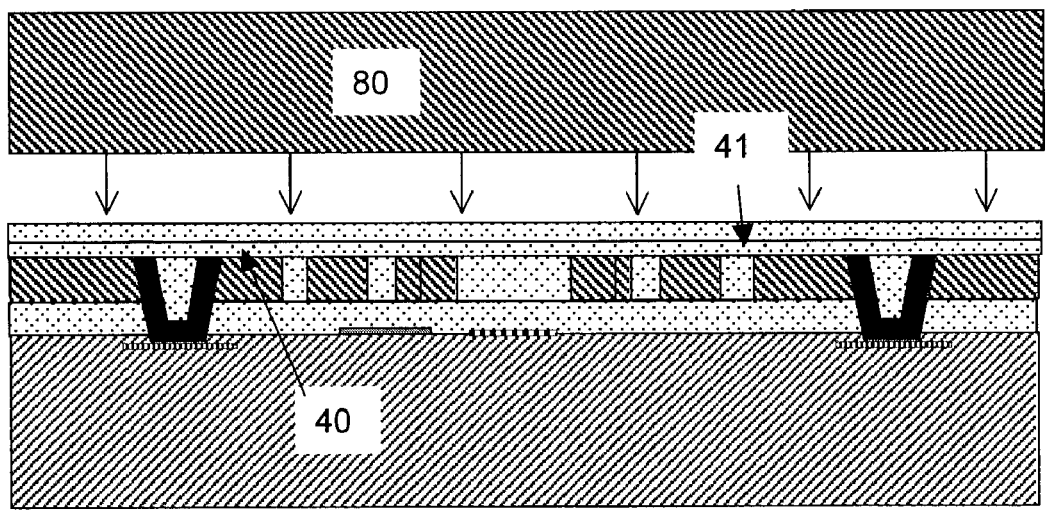
FIG. 17 is a cross-sectional view of the third stage of production of the inertial sensors having multiple layers of suspended structures.
Figure 18:
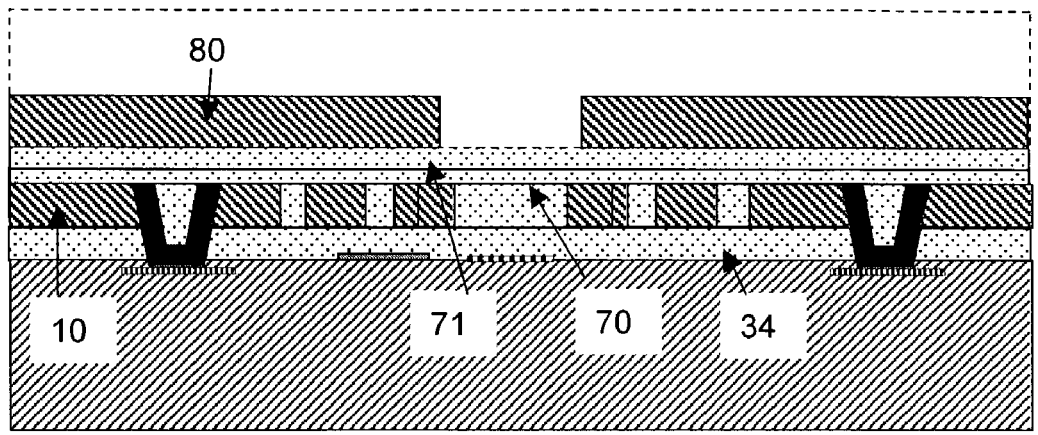
FIG. 18 is a cross-sectional view of the fourth stage of production of the inertial sensors having multiple layers of suspended structures.

The number of bonded mono-crystalline silicon layers is not limited to just a single layer as shown in FIG. 1 to FIG. 15. Multiple suspended layers may be needed for MEMS devices with higher complexity and/or better performance. A preferred embodiment to implement multiple suspended mono-crystalline silicon layers is shown in steps described in figures starting FIG. 15. Here an unfinished MEMS wafer, such as one in FIG. 8, whose sacrificial layer is not etched, is coated with a thick layer of epoxy 70, which is then cured. Next the epoxy layer 70 is thinned and planarized by polishing to a desired thickness (FIG. 16). Subsequently a thin layer of epoxy 71 is applied, and another doped mono-crystalline silicon wafer 80 is bonded to the MEMS wafer (FIG. 17) using the method described previously. The bonded wafer 80 is subsequently thinned and polished to the desired thickness and patterned and etched to expose the alignment marks, and then ohmic contacts and/or landing pads (not shown) are formed on the polished surface (FIG. 18).

Figure 19:
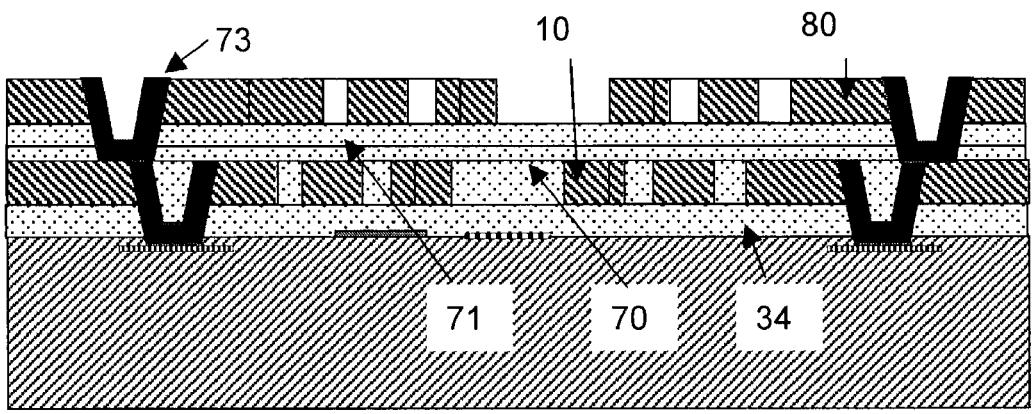
FIG. 19 is a cross-sectional view of the fifth stage of production of the inertial sensors having multiple layers of suspended structures.
Figure 20:
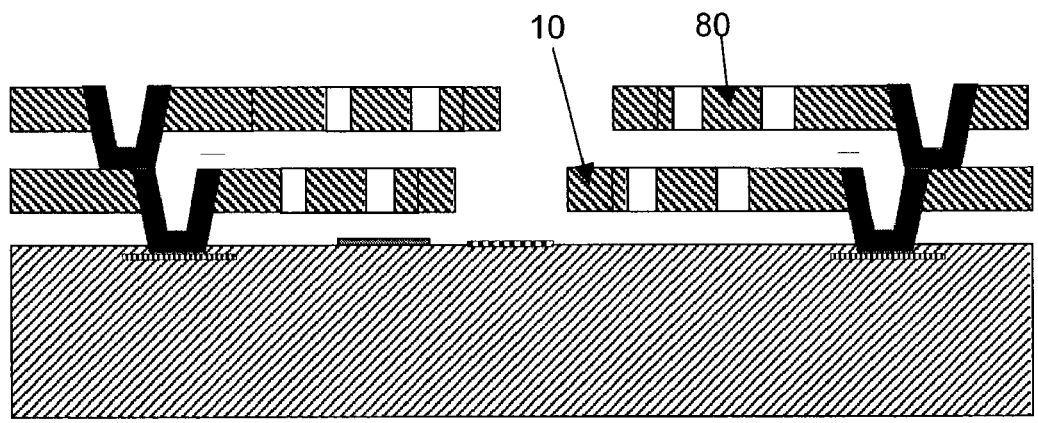
FIG. 20 is a cross-sectional view of the sixth stage of production of the example inertial sensors after the polymeric bonding layers are partially or completely removed such that the layers of movable suspended structures suspended structures are released.

Next via holes are patterned and etched to the landing pads on the first layer 10 through the top layer 80, the epoxy bonding layers 70 and 71. Next, metal pillars 73 are formed by sputtering and etching (FIG. 19) as before, and through trenches are patterned and etched in the top wafer 80 also in FIG. 19. The metal pillar pattern and the trench pattern are such that unwanted epoxy is exposed to the oxygen plasma during dry etch for removal. Additional monocrystalline silicon layers for suspended structures can be added using this process. Then the wafer is diced into individual devices and mounted in packages. An oxygen-containing plasma etch is used to etch and undercut all or part of the epoxy layers such as 70, 71 and 34, freeing bonded and etched suspended structures made from monocrystalline layers 10 and 80. Either the remnant epoxy or the metal plugs 44, or both support the suspended structures made from layers 10 and 80.

The embodiments and examples set forth herein are presented in order to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teachings without departing form the spirit and scope of the following claims.

What is claimed is:

1. A method of manufacturing a micro-electro-mechanical (MEMS) device, comprising the steps of:
    providing a substrate wafer having electrical elements, and a second wafer;
    bonding said substrate wafer and said second wafer with an adhesive or epoxy layer;
    patterning a plurality of via holes and/or openings in said second wafer and said adhesive layer;
    etching said via holes and/or openings through said second wafer and said adhesive layer;
    depositing metal layers in said via holes to form electrical interconnects between said second wafer and said substrate wafer;
    etching said second wafer with patterns of suspended structures and fixed structures;
    etching said adhesive layer with undercut to said second wafer, forming said suspended structures and said fixed structures from seconded wafer; wherein said electrical interconnects and/or said adhesive layer jointly or independently support or anchor said suspended structures.

2. The method of claim 1, wherein said electrical elements comprises integrated circuits and wherein said suspended structures and said electrical elements are configured to form integrated MEMS devices including accelerometers or gyroscopes.

3. The method of claim 1, wherein said micro-electro-mechanical (MEMS) device is a gyroscope or an accelerometer.

4. The method of claim 1, wherein the step of providing a substrate wafer further comprises the step of forming a plurality of polymer dot of predetermined pattern and thickness on said substrate wafer before said bonding.

5. The method of manufacturing a micro-electro-mechanical (MEMS) device in claim 1, further comprising the steps of,
    prior to the step of said etching said adhesive layer:
    providing a third wafer;
    applying another layer of adhesive to said second wafer and/or said third wafer;
    bonding said third wafer to said second wafer with said another layer of adhesive;
    etching said third wafer to form a second suspended structure; and
    etching said another layer of adhesive; prior to said etching said adhesive layer with undercut.

6. The method of claim 5, further comprising the step of forming metal interconnect/pillars between said second wafer and said third wafer.

7. The method of manufacturing a micro-electro-mechanical (MEMS) device of claim 1, wherein said second wafer or is of chip size or substantially smaller than said substrate wafer, the step of said bonding to said substrate wafer is done repeatedly to distribute a multiplicity of said second wafers over said substrate wafer at pre-determined locations using a pick-and-place system.

8. A system for manufacturing a micro-electro-mechanical (MEMS) device, capable of performing said steps in claim 1, including mixing or preparing, dispensing, and spin casting said adhesive or epoxy, and bonding said substrate wafer and said second wafer with an adhesive layer.

* * * * *